(12) United States Patent
Xu et al.

(10) Patent No.: US 11,832,491 B2
(45) Date of Patent: Nov. 28, 2023

(54) PIXEL STRUCTURE WITH DIFFERENT DISTANCE BETWEEN ADJACENT SUBPIXELS AND PIXELS, DISPLAY SUBSTRATE AND DRIVING METHOD THEREFOR, AND DISPLAY DEVICE

(71) Applicants: Hefei BOE Optoelectronics Technology Co., Ltd., Anhui (CN); BOE Technology Group Co., Ltd., Beijing (CN)

(72) Inventors: Fei Xu, Beijing (CN); Jun Hong, Beijing (CN); Jingyong Li, Beijing (CN); Yanbin Wang, Beijing (CN); Wenhong Tian, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/802,540

(22) PCT Filed: Nov. 16, 2021

(86) PCT No.: PCT/CN2021/130807
§ 371 (c)(1),
(2) Date: Aug. 26, 2022

(87) PCT Pub. No.: WO2022/160871
PCT Pub. Date: Aug. 4, 2022

(65) Prior Publication Data
US 2023/0101671 A1    Mar. 30, 2023

(30) Foreign Application Priority Data
Jan. 28, 2021 (CN) .......................... 202110116042.1

(51) Int. Cl.
*H10K 59/35* (2023.01)
*G09G 3/20* (2006.01)
(Continued)

(52) U.S. Cl.
CPC ......... *H10K 59/351* (2023.02); *G09G 3/2003* (2013.01); *G09G 3/3275* (2013.01);
(Continued)

(58) Field of Classification Search
CPC .................................................... H10K 59/351
(Continued)

(56) References Cited

U.S. PATENT DOCUMENTS

2008/0258608 A1* 10/2008 Chao .................... H10K 50/858
445/24
2009/0109172 A1*  4/2009 Lee ......................... G09G 3/344
345/107

(Continued)

FOREIGN PATENT DOCUMENTS

| CN | 101051649 A | 10/2007 |
| CN | 106920832 A |  7/2017 |

(Continued)

OTHER PUBLICATIONS

International Search Report for PCT/CN2021/130807 dated Feb. 10, 2022.
(Continued)

*Primary Examiner* — Long D Pham
(74) *Attorney, Agent, or Firm* — Ling Wu; Stephen Yang; Ling and Yang Intellectual Property

(57) ABSTRACT

A pixel structure, a display substrate and a driving method therefor, and a display device. The pixel structure includes a plurality of pixel units; each pixel unit comprises a first sub-pixel, a second sub-pixel, a third sub-pixel, and a central sub-pixel; the central sub-pixel is located in an area enclosed by the first sub-pixel, the second sub-pixel, and the third sub-pixel; the minimum distance from the central sub-pixel to at least one of the first sub-pixel, the second sub-pixel, and the third sub-pixel in a same pixel unit is less than the distance between two adjacent pixel units.

19 Claims, 8 Drawing Sheets

(51) Int. Cl.
*G09G 3/3275* (2016.01)
*H10K 59/38* (2023.01)

(52) U.S. Cl.
CPC ......... *H10K 59/352* (2023.02); *H10K 59/353* (2023.02); *G09G 2300/0452* (2013.01); *H10K 59/38* (2023.02)

(58) Field of Classification Search
USPC ........................................................ 345/690
See application file for complete search history.

(56) References Cited

U.S. PATENT DOCUMENTS

| | | | | |
|---|---|---|---|---|
| 2011/0102313 | A1* | 5/2011 | Hsieh | G02F 1/1679 |
| | | | | 427/559 |
| 2016/0300520 | A1* | 10/2016 | Wang | G09F 9/30 |
| 2017/0343844 | A1 | 11/2017 | Aoki | |
| 2020/0234633 | A1 | 7/2020 | Wang et al. | |
| 2020/0258441 | A1 | 8/2020 | Zhang et al. | |
| 2020/0279892 | A1 | 9/2020 | Chen et al. | |
| 2021/0027691 | A1 | 1/2021 | Hu et al. | |
| 2021/0294445 | A1 | 9/2021 | Du et al. | |
| 2022/0293693 | A1 | 9/2022 | Yuan | |

FOREIGN PATENT DOCUMENTS

| | | |
|---|---|---|
| CN | 106935198 A | 7/2017 |
| CN | 109037287 A | 12/2018 |
| CN | 109871159 A | 6/2019 |
| CN | 110998852 A | 4/2020 |
| CN | 112909058 A | 6/2021 |
| JP | 2017-211484 A | 11/2017 |

OTHER PUBLICATIONS

First Office Action dated May 31, 2023 for Chinese Patent Application No. 202110116042.1 and English Translation.

* cited by examiner

US 11,832,491 B2

PIXEL STRUCTURE WITH DIFFERENT DISTANCE BETWEEN ADJACENT SUBPIXELS AND PIXELS, DISPLAY SUBSTRATE AND DRIVING METHOD THEREFOR, AND DISPLAY DEVICE

CROSS-REFERENCE TO RELATED APPLICATIONS

The present application is a U.S. National Phase Entry of International Application No. PCT/CN2021/130807 having an international filing date of Nov. 16, 2021, which claims priority to Chinese patent application No. 202110116042.1, entitled "Pixel Structure, Display Substrate and Driving Method Thereof, and Display Apparatus", filed to the CNIPA on Jan. 28, 2021. The above-identified applications are hereby incorporated by reference.

TECHNICAL FIELD

Embodiments of the present disclosure relate to, but are not limited to, the field of display technologies, and particularly to a pixel structure, a display substrate and a driving method thereof, and a display apparatus.

BACKGROUND

An Organic Light-Emitting Diode (OLED) display device has the advantages of thin thickness, light weight, wide viewing angle, active luminescence, continuous and adjustable luminous color, low cost, fast response, low driving voltage, wide working temperature range, simple production process, flexible display, and the like, and is more and more widely used in display fields such as mobile phones, tablet computers, and digital cameras.

At present, most OLED display devices adopt a design of a pixel structure in a standard RGB (red, green, and blue) arrangement or a Delta arrangement, and have problems of relatively low transmittance, relatively low luminous efficiency, and relatively high power consumption.

SUMMARY

The following is a summary of subject matters described herein in detail. The summary is not intended to limit the protection scope of claims.

Embodiments of the present disclosure mainly provide following technical solutions.

In a first aspect, an embodiment of the present disclosure provides a pixel structure, including: a plurality of pixel units; herein, each pixel unit includes a first sub-pixel, a second sub-pixel, a third sub-pixel, and a center sub-pixel, wherein the center sub-pixel is located inside a region surrounded by the first sub-pixel, the second sub-pixel, and the third sub-pixel; a minimum distance between the center sub-pixel and at least one of the first sub-pixel, the second sub-pixel, and the third sub-pixel within a same pixel unit is smaller than a distance between two adjacent pixel units.

In a second aspect, an embodiment of the present disclosure provides a display substrate, including an underlay substrate, a pixel driving circuit, and a pixel structure in the above embodiment which are stacked in sequence.

In a third aspect, an embodiment of the present disclosure provides a driving method for a display substrate, wherein the display substrate is the display substrate in the above embodiment; and the driving method includes: for at least one pixel unit in a plurality of pixel units, inputting a data signal to at least one of a first sub-pixel, a second sub-pixel, and a third sub-pixel in the at least one pixel unit through a pixel driving circuit in a data writing stage; and inputting a high impedance signal to a center sub-pixel through the pixel driving circuit in the data writing stage and a light-emitting stage after the data writing stage, to drain a leakage current between at least one of the first sub-pixel, the second sub-pixel, and the third sub-pixel in the at least one pixel unit and the center sub-pixel to the center sub-pixel, driving the center sub-pixel to emit light.

In a fourth aspect, an embodiment of the present disclosure provides a display apparatus, including the display substrate in the above embodiment.

Other characteristics and advantages of the present disclosure will be elaborated in the following specification, and moreover, partially become apparent from the specification or are understood by implementing the present disclosure. Other advantages of the present disclosure may be achieved and obtained through solutions described in the specification and drawings.

Other aspects may be understood upon reading and understanding the drawings and the detailed description.

BRIEF DESCRIPTION OF DRAWINGS

The accompanying drawings are used for providing understanding for the technical solutions of the present disclosure, and form a part of the specification. They are used for explaining the technical solutions of the present disclosure together with the embodiments of the present disclosure, but do not form a limitation on the technical solutions of the present disclosure. Shapes and sizes of various components in the drawings do not reflect actual scales, and are only intended to schematically illustrate contents of the present disclosure.

DETAILED DESCRIPTION

Figure 1A:
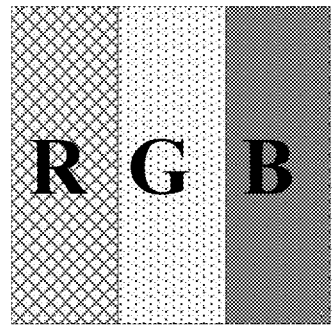
FIG. 1A is a schematic diagram of a pixel structure in some technologies.

There are a plurality of embodiments described in the present disclosure. However, the description is exemplary and unrestrictive, and more embodiments and implementation solutions are possible within a scope contained in the embodiments described herein. Although many possible combinations of features are shown in the accompanying drawings and discussed in specific implementations, many other combinations of the disclosed features are also possible. Unless expressly limited, any feature or element of any embodiment may be used in combination with, or may replace, any other feature or element in any other embodiment.

When describing representative embodiments, the specification may have presented methods and/or processes as a specific order of steps. However, to an extent that the method or process does not depend on a specific sequence of the acts herein, the method or process should not be limited to the acts in the specific sequence. Those of ordinary skills in the art will understand that other orders of act may also be possible. Therefore, the specific order of the steps illustrated in the specification should not be interpreted as a limitation on claims. Moreover, the claims directed to the method and/or process should not be limited to performing their acts in the described order, and those skilled in the art will readily understand that these orders may be varied and still remain within the essence and scope of the embodiments of the present disclosure.

In the drawings, a size of each constituent element, a thickness of a layer, or a region is exaggerated sometimes for clarity. Therefore, one mode of the present disclosure is not necessarily limited to the size, and shapes and sizes of various components in the drawings do not reflect actual scales. In addition, the drawings schematically illustrate ideal examples, and one embodiment of the present disclosure is not limited to the shapes, numerical values, or the like shown in the drawings.

Ordinal numerals such as "first", "second", and "third" herein are set to avoid confusion between constituent elements, but are not intended to limit in terms of quantity.

Herein, for convenience, wordings indicating orientations or positional relationships, such as "center", "upper", "lower", "front", "back", "vertical", "horizontal", "top", "bottom", "inside", "outside", and the like are used to describe the positional relationships between the constituent elements with reference to the accompanying drawings, and are merely for facilitating describing the document and simplifying the description, rather than indicating or implying that the referred apparatuses or elements must have particular orientations, and be constructed and operated in particular orientations. Thus, they cannot be understood as a limitation on the present disclosure. The positional relationships between the constituent elements may be changed as appropriate according to directions for describing the constituent elements. Therefore, appropriate replacements can be made according to situations without being limited to the wordings described in the specification.

Herein, a transistor refers to an element at least including three terminals, i.e., a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. Herein, the channel region refers to a region through which the current mainly flows. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable herein.

In the present disclosure, "about" refers to that a boundary is defined not so strictly and numerical values within process and measurement error ranges are allowed.

Figure 1B:
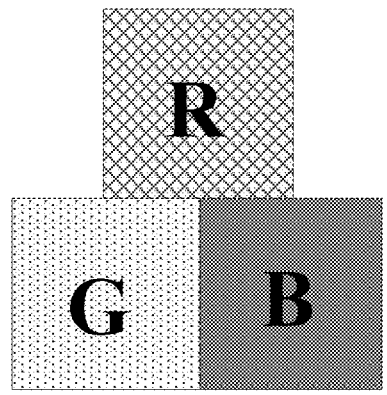
FIG. 1B is another schematic diagram of a pixel structure in some technologies.

Most display devices, such as Micro OLED display devices, adopt a pixel design in a standard RGB (red, green, and blue) arrangement as shown in FIG. 1A or a Delta arrangement as shown in FIG. 1B, which causes most OLED display devices to have problems that leakage is easy to occur between adjacent anodes and a transmittance is relatively low, resulting in some problems such as relatively high power consumption, relatively low luminous efficiency, and accompanying color crosstalk. Moreover, the higher a Pixel Per Inch (PPI) of an OLED display device, the smaller a distance between adjacent anodes, so that the higher the PPI of the OLED display device, the more serious the leakage. For example, the inventor of the present disclosure experimentally obtained a leakage of about 40% between adjacent anodes of a 0.71-inch Full High Definition (FHD) Micro OLED display device.

An embodiment of the present disclosure provides a pixel structure, wherein the pixel structure may include a plurality of pixel units; herein, each pixel unit may include a first sub-pixel, a second sub-pixel, a third sub-pixel, and a center sub-pixel, wherein the center sub-pixel is located inside a region surrounded by the first sub-pixel, the second sub-pixel, and the third sub-pixel; a minimum distance between a center sub-pixel and at least one of a first sub-pixel, a second sub-pixel, and a third sub-pixel within a same pixel unit is smaller than a distance between two adjacent pixel units. In this way, the center sub-pixel within the same pixel unit is disposed to be located inside the region surrounded by the first sub-pixel, the second sub-pixel, and the third sub-pixel, so that within a single pixel unit, a first sub-pixel, a second sub-pixel, and a third sub-pixel may surround a center sub-pixel, and because the minimum distance between the center sub-pixel and at least one of the first sub-pixel, the second sub-pixel, and the third sub-pixel within the same pixel unit is smaller than the distance between two adjacent pixel units, then, when a hole is injected into at least one of the first sub-pixel, the second sub-pixel, and the third sub-pixel within the same pixel unit, a leakage current will flow to the center sub-pixel, so that it can be achieved that the center sub-pixel is made to emit light by using the leakage current. Therefore, the transmittance and the luminous efficiency can be improved, and the power consumption can be reduced.

In an exemplary embodiment, a geometric center of the center sub-pixel may coincide with a geometric center of the region surrounded by the first sub-pixel, the second sub-pixel, and the third sub-pixel.

In an exemplary embodiment, a minimum distance between the center sub-pixel and the first sub-pixel within the same pixel unit is a first distance; a minimum distance between the center sub-pixel and the second sub-pixel within the same pixel unit is a second distance; a minimum distance between the center sub-pixel and the third sub-pixel within the same pixel unit is a third distance; a distance between two adjacent pixel units is a fourth distance; the minimum distance between the center sub-pixel and at least one of the first sub-pixel, the second sub-pixel, and the third sub-pixel within the same pixel unit is smaller than the distance between two adjacent pixel units, which may include: a ratio of the first distance to the fourth distance may be about 0.4 to 0.6, a ratio of the second distance to the fourth distance may be about 0.4 to 0.6, and a ratio of the third distance to the fourth distance may be about one or more of 0.4 to 0.6.

In an exemplary embodiment, a shape of the pixel unit may be a polygon such as a triangle, or a rectangle, etc.

In an exemplary embodiment, a shape of the first sub-pixel may be a polygon such as a triangle, or a rectangle, etc.

In an exemplary embodiment, a shape of the second sub-pixel may be a polygon such as a triangle, or a rectangle, etc.

In an exemplary embodiment, a shape of the third sub-pixel may be a polygon such as a triangle, or a rectangle, etc.

In an exemplary embodiment, a shape of the center sub-pixel may be a polygon such as a triangle, or a rectangle, etc.

In an exemplary embodiment, the shapes of the first sub-pixel, the second sub-pixel, the third sub-pixel, and the center sub-pixel, as well as the shape of each pixel unit, may all be triangles. For example, the shapes of the first sub-pixel, the second sub-pixel, the third sub-pixel, and the center sub-pixel within each pixel unit, as well as the shape of each pixel unit may all be isosceles triangles. Or, the shapes of the first sub-pixel, the second sub-pixel, the third sub-pixel, and the center sub-pixel within each pixel unit, as well as the shape of each pixel unit may all be right triangles. In other exemplary embodiments, the shapes of the first sub-pixel, the second sub-pixel, the third sub-pixel, and the center sub-pixel within each pixel unit, as well as the shape of each pixel unit may be triangles of another shape, for example, equilateral triangles, or isosceles right triangles, etc., in addition to the two shapes of the above examples. No limitation is made thereto in the embodiment of the present disclosure. In this way, the shapes of the pixel unit and the sub-pixels within the pixel unit are designed into triangles, and the center sub-pixel within the same pixel unit is disposed to be located inside the region surrounded by the first sub-pixel, the second sub-pixel, and the third sub-pixel, so that within a single pixel unit, a first sub-pixel, a second sub-pixel, and a third sub-pixel surround three edges of a center sub-pixel, and because the minimum distance between the center sub-pixel and at least one of the first sub-pixel, the second sub-pixel, and the third sub-pixel within the same pixel unit is smaller than the distance between two adjacent pixel units, then, when a hole is injected into at least one of the first sub-pixel, the second sub-pixel, and the third sub-pixel within the same pixel unit, a leakage current will flow to the corresponding center sub-pixel, so that it can be achieved that the center sub-pixel is made to emit light by using the leakage current. Therefore, the transmittance and the luminous efficiency can be improved, and the power consumption can be reduced. Furthermore, a cross-color problem among the first sub-pixel, the second sub-pixel, and the third sub-pixel can be improved.

In an exemplary embodiment, areas of the first sub-pixel, the second sub-pixel, and the third sub-pixel within the same pixel unit may all be larger than an area of the center sub-pixel.

In an exemplary embodiment, the areas of the first sub-pixel, the second sub-pixel, and the third sub-pixel within the same pixel unit are equal.

In an exemplary embodiment, emitting colors of the center sub-pixel, the first sub-pixel, the second sub-pixel, and the third sub-pixel within the same pixel unit are different. For example, the emitting color of the center sub-pixel is any one of white and yellow; the emitting color of the first sub-pixel is any one of red, green, and blue; the emitting color of the second sub-pixel is any one of red, green, and blue; and the emitting color of the third sub-pixel is any one of red, green, and blue, wherein the emitting colors of the first sub-pixel, the second sub-pixel, and the third sub-pixel are different.

Hereinafter, a pixel structure provided by an embodiment of the present disclosure will be described by taking the shape of the pixel unit being a triangle, and taking the shapes of the first sub-pixel, the second sub-pixel, the third sub-pixel, and the center sub-pixel within the pixel unit being all triangles as an example.

Figure 2:
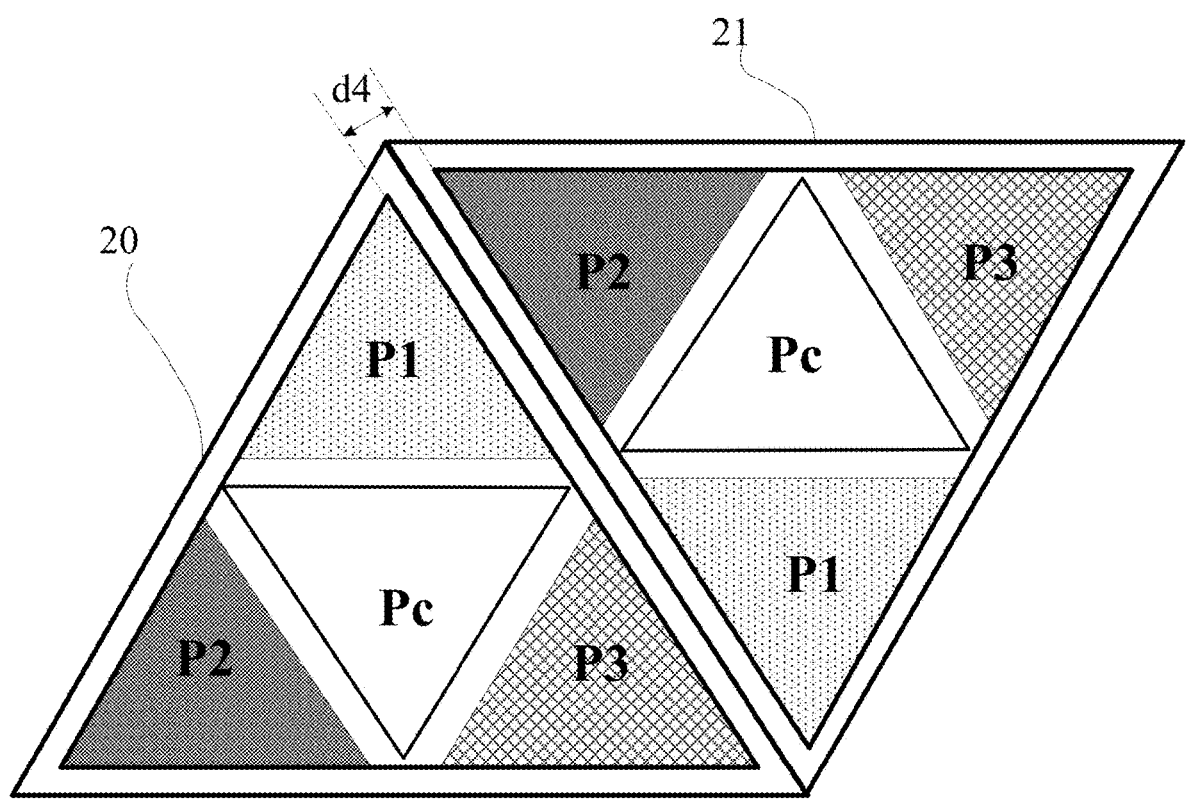
FIG. 2 is a structural schematic diagram of a pixel structure in an embodiment of the present disclosure.

FIG. 2 is a structural schematic diagram of a pixel structure in an embodiment of the present disclosure. As shown in FIG. 2, two pixel units in the pixel structure are shown in FIG. 2, and include a first pixel unit 20 and a second pixel unit 21, wherein shapes of the first pixel unit 20 and the second pixel unit 21 are both isosceles triangles, the first pixel unit 20 and the second pixel unit 21 may each include one first sub-pixel P1, one second sub-pixel P2, one third sub-pixel P3, and one center sub-pixel Pc, and within the same pixel unit, the center sub-pixel Pc is located inside a region surrounded by the first sub-pixel P1, the second sub-pixel P2, and the third sub-pixel P3. In FIG. 2, the shapes of the first sub-pixel P1, the second sub-pixel P2, the third sub-pixel P3, and the center sub-pixel Pc within the first pixel unit 20 and the second pixel unit 21 are all isosceles triangles. For example, as shown in FIG. 2, the two pixel units may form a repetitive structure in a shape of a diamond.

Figure 3:
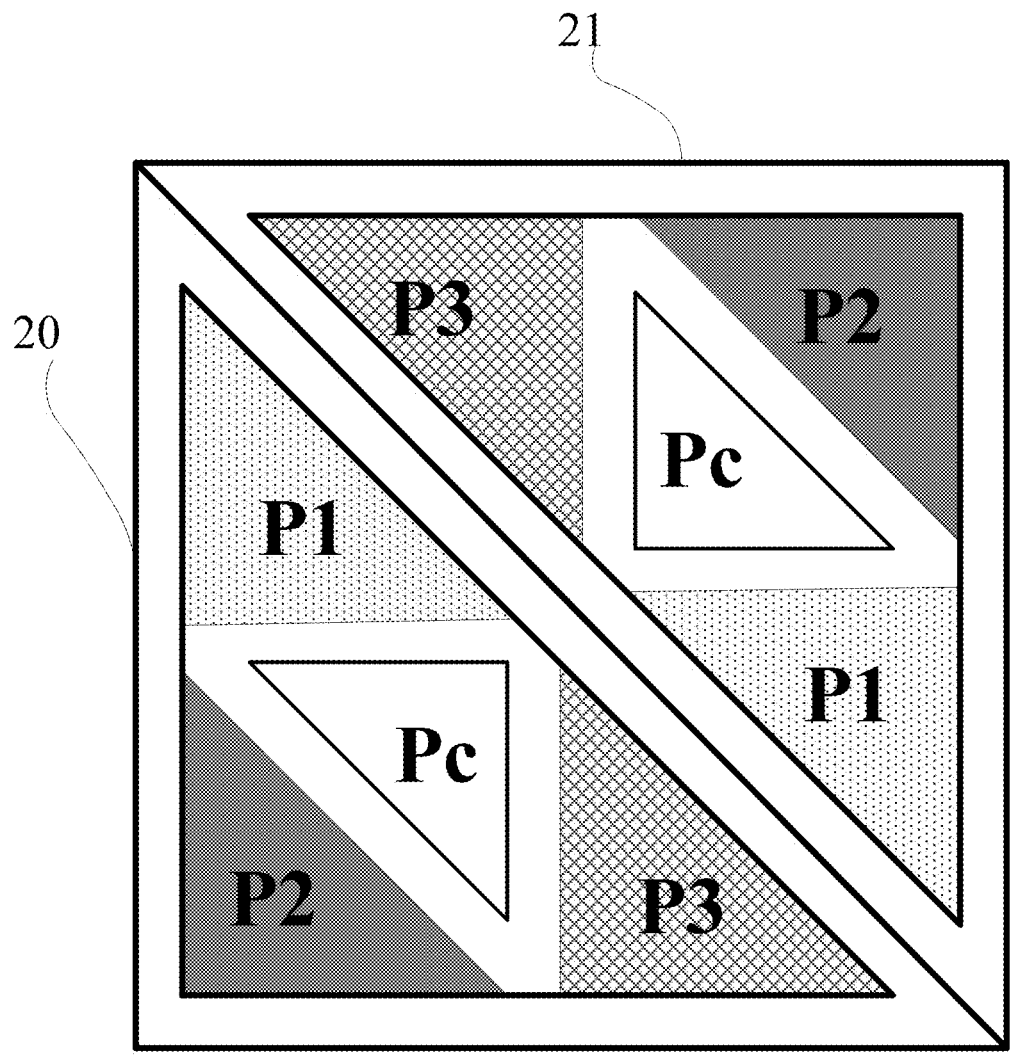
FIG. 3 is another structural schematic diagram of a pixel structure in an embodiment of the present disclosure.

FIG. 3 is another structural schematic diagram of a pixel structure in an embodiment of the present disclosure. As shown in FIG. 3, two pixel units in the pixel structure are shown in FIG. 3, and include a first pixel unit 20 and a second pixel unit 21, wherein shapes of the first pixel unit 20 and the second pixel unit 21 are both right triangles, and the first pixel unit 20 and the second pixel unit 21 may each include one first sub-pixel P1, one second sub-pixel P2, one third sub-pixel P3 and one center sub-pixel Pc; within the same pixel unit, the center sub-pixel Pc is located inside a region surrounded by the first sub-pixel P1, the second sub-pixel P2, and the third sub-pixel P3; and shapes of the first sub-pixels P1, the second sub-pixels P2, the third sub-pixels P3, and the center sub-pixels Pc within the first pixel unit 20 and the second pixel unit 21 are all right triangles. For example, as shown in FIG. 3, the two pixel units may form a repetitive structure in a shape of a rectangle.

Figure 4:
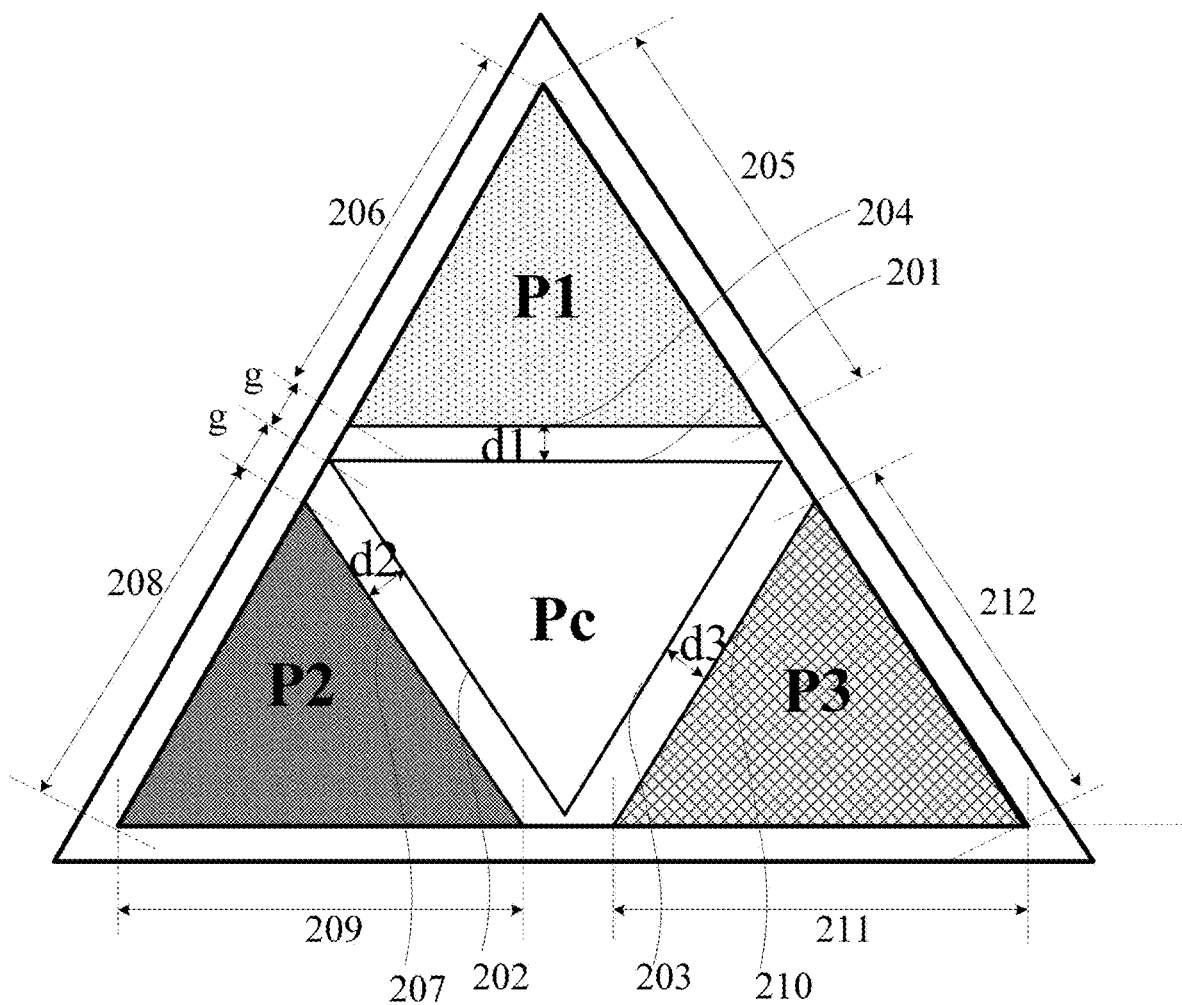
FIG. 4 is further another structural schematic diagram of a pixel structure in an embodiment of the present disclosure.

In an exemplary embodiment, as shown in FIG. 4, one pixel unit in the pixel structure is shown in FIG. 4, and the pixel unit may include one first sub-pixel P1, one second sub-pixel P2, one third sub-pixel P3, and one center sub-pixel Pc, wherein the center sub-pixel Pc may include a first edge 201 (e.g. a bottom edge), a second edge 202 (e.g. a waist), and a third edge 203 (e.g. a waist); the first sub-pixel P1 may include a fourth edge 204 (e.g. a bottom edge), a fifth edge 205 (e.g. a waist), and a sixth edge 206 (e.g. a waist), the fourth edge 204 corresponding and being adjacent to the first edge 201; the second sub-pixel P2 may include a seventh edge 207 (e.g. a bottom edge), an eighth edge 208 (e.g. a waist), and a ninth edge 209 (e.g. a waist), the seventh edge 207 corresponding and being adjacent to the second edge 202; and the third sub-pixel P3 may include a tenth side 210, an eleventh side 211 (e.g. a waist), and a twelfth side 212 (e.g. a waist), the tenth side 210 corresponding and being adjacent to the third side 203. In this way, by disposing the fourth edge 204 of the first sub-pixel P1 to correspond and be adjacent to the first edge 201 of the center sub-pixel Pc, the seventh edge 207 of the second sub-pixel P2 to correspond and be adjacent to the second edge 202 of the center sub-pixel Pc, and the tenth edge 210 of the third sub-pixel P3 to correspond and be adjacent to the third edge 203 of the center sub-pixel Pc, the center sub-pixel Pc may be disposed inside a polygon region surrounded by the fourth side 204 of the first sub-pixel P1, the seventh side 207 of the second sub-pixel P2, and the tenth side 210 of the third sub-pixel P3. Herein, a distance between the fourth side 204 and the first side 201 (i.e. a minimum distance between the center sub-pixel Pc and the first sub-pixel P1 within the first pixel unit 20) is a first distance d1, a distance between the seventh edge 207 and the second edge 202 (i.e. a minimum distance between the center sub-pixel Pc and the second sub-pixel P2 within the first pixel unit 20) is a second distance d2, and a distance between the tenth edge 210 and the third edge 203 (i.e. a minimum distance between the center sub-pixel Pc and the third sub-pixel P3 within the first pixel unit 20) is a third distance d3. As shown in FIG. 2, a distance between the first pixel unit 20 and the second pixel unit 21 (i.e. the distance between two adjacent pixel units) is a fourth distance d4, then the minimum distance between the center sub-pixel and at least one of the first sub-pixel, the second sub-pixel, and the third sub-pixel within the same pixel unit is smaller than the distance between two adjacent pixel units, which may include any one or more of that the first distance d1 is less than the fourth distance d4, the second distance d2 is less than the fourth distance d4, and the third distance d3 is less than the fourth distance d4.

In an exemplary embodiment, the first distance d1, the second distance d2, and the third distance d3 may be equal. In this way, a leakage current can be made to uniformly flow to the center sub-pixel, thereby more effectively improving the transmittance and the luminous efficiency, and reducing the power consumption.

In an exemplary embodiment, a ratio of the first distance d1 to the fourth distance d4 may be about 0.4 to 0.6. For example, the ratio of the first distance d1 to the fourth distance d4 may be about 0.5.

In an exemplary embodiment, a ratio of the second distance d2 to the fourth distance d4 may be about 0.4 to 0.6. For example, the ratio of the second distance d2 to the fourth distance d4 may be about 0.5.

In an exemplary embodiment, a ratio of the third distance d3 to the fourth distance d4 may be about 0.4 to 0.6. For example, the ratio of the third distance d2 to the fourth distance d4 may be about 0.5.

For example, taking the pixel structure in the embodiment of the present disclosure being applied into a 0.71 inch full high definition Micro OLED display device as an example, size information of the pixel structure may be set as follows: a distance between the center sub-pixel and the first sub-pixel within the same pixel unit may be about 0.6 μm (micron), for example, as shown in FIG. 4, a distance between the fourth edge 204 and the first edge 201 may be about 0.6 μm; a distance between the center sub-pixel and the second sub-pixel within the same pixel unit may be about 0.6 μm, for example, as shown in FIG. 4, a distance between the seventh edge 207 and the second edge 202 may be about 0.6 μm; a distance between the center sub-pixel and the third sub-pixel within the same pixel unit may be about 0.6 μm, for example, as shown in FIG. 4, a distance between the tenth edge 210 and the third edge 203 may be about 0.6 μm; the distance between two adjacent pixel units may be about 1.20 μm, for example, as shown in FIG. 2, the fourth distance d4 may be about 1.20 μm; the first sub-pixel, the second sub-pixel, and the third sub-pixel may all be isosceles triangles with bottom edges of about 10.58 μm and waists of about 7.48 μm, for example, as shown in FIG. 4, the fourth edge 204, the seventh edge 207, and the tenth edge 210 may be about 10.58 μm, and the fifth edge 205, the sixth edge 206, the eighth edge 208, the ninth edge 209, the eleventh edge 211, and the twelfth edge 212 may be about 7.48 μm; the center sub-pixel may be an isosceles triangle with a bottom edge of about 6.64 μm and a waist of about 4.69 μm, for example, as shown in FIG. 4, the first edge 201 may be about 6.64 μm, the second edge 202 and the third edge 203 may be about 4.69 μm.

In an exemplary embodiment, as shown in FIG. 4, a minimum distance between two adjacent vertexes in the first sub-pixel, the second sub-pixel, and the third sub-pixel may be twice a fifth distance g. For example, the fifth distance g may be about 0.85 μm.

In an exemplary embodiment, the emitting colors of the first sub-pixel P1, the second sub-pixel P2, and the third sub-pixel P3 may be any one of red (R), green (G), and blue (B), respectively. Here, an arrangement order of the emitting colors of the first sub-pixel P1, the second sub-pixel P2, and the third sub-pixel P3 may be arbitrarily set, for example, red (R), green (G), and blue (B) may correspond to the third sub-pixel P3, the first sub-pixel P1, and the second sub-pixel P2, respectively, or, red (R), green (G), and blue (B) may correspond to the first sub-pixel P1, the third sub-pixel P3, and the second sub-pixel P2, respectively, or red (R), green (G), and blue (B) may correspond to the second sub-pixel P2, the third sub-pixel P3, and the first sub-pixel P1, respectively, or the like, which is not limited by the embodiment of the present disclosure.

In an exemplary embodiment, an emitting color of the center sub-pixel Pc may be a color other than red, green, and blue, for example, the emitting color of the center sub-pixel Pc may be any one of white and yellow.

For example, the emitting color of the center sub-pixel Pc may be white, the emitting color of the first sub-pixel P1 is green, the emitting color of the second sub-pixel P2 is blue, and the emitting color of the third sub-pixel P3 is red. In this way, by disposing a white sub-pixel inside a region surrounded by a red sub-pixel, a green sub-pixel, and a blue sub-pixel, not only the transmittance and the emitting efficiency of a device can be improved, but also a color mixing effect can be improved, thereby improving a quality of a display screen.

An embodiment of the present disclosure provides a display substrate, wherein in a direction perpendicular to the display substrate, the display substrate may include an underlay substrate, a pixel driving circuit, and a pixel structure in the above one or more embodiments which are stacked in sequence.

In an exemplary embodiment, for the first sub-pixel, the second sub-pixel, the third sub-pixel, and the center sub-pixel within the same pixel unit, the first sub-pixel may include a first light-emitting element and a first light filtering unit stacked in sequence; the second sub-pixel may include a second light-emitting element and a second light filtering unit stacked in sequence; the third sub-pixel may include a third light-emitting element and a third light filtering unit stacked in sequence; the center sub-pixel may include a center light-emitting element and a center light filtering unit stacked in sequence; and an orthographic projection of the center light filtering unit on the underlay substrate and orthographic projections of the first light filtering unit, the second light filtering unit, and the third light filtering unit on the underlay substrate all have overlapping regions.

In an exemplary embodiment, colors of the center light filtering unit, the first light filtering unit, the second light filtering unit, and the third light filtering unit within the same pixel unit are different. For example, the center light filtering unit may be any one of a white light filtering unit and a yellow light filtering unit; the first light filtering unit may be any one of a red light filtering unit, a green light filtering unit, and a blue light filtering unit; the second light filtering unit may be any one of a red light filtering unit, a green light filtering unit, and a blue light filtering unit; and the third light filtering unit may be any one of a red light filtering unit, a green light filtering unit, and a blue light filtering unit.

Here, an arrangement order of the center light filtering unit, the first light filtering unit, the second light filtering unit, and the third light filtering unit may be arbitrarily set, for example, the red light filtering unit, the green light filtering unit, and the blue light filtering unit may correspond to the third light filtering unit, the first light filtering unit, and the second light filtering unit, respectively, or, the red light filtering unit, the green light filtering unit, and the blue light filtering unit may correspond to the first light filtering unit, the third light filtering unit, and the second light filtering unit, respectively, or, the red light filtering unit, the green light filtering unit, and the blue light filtering unit may correspond to the second light filtering unit, the third light filtering unit, and the first light filtering unit, respectively, or the like, which is not limited by the embodiment of the present disclosure.

Figure 5:
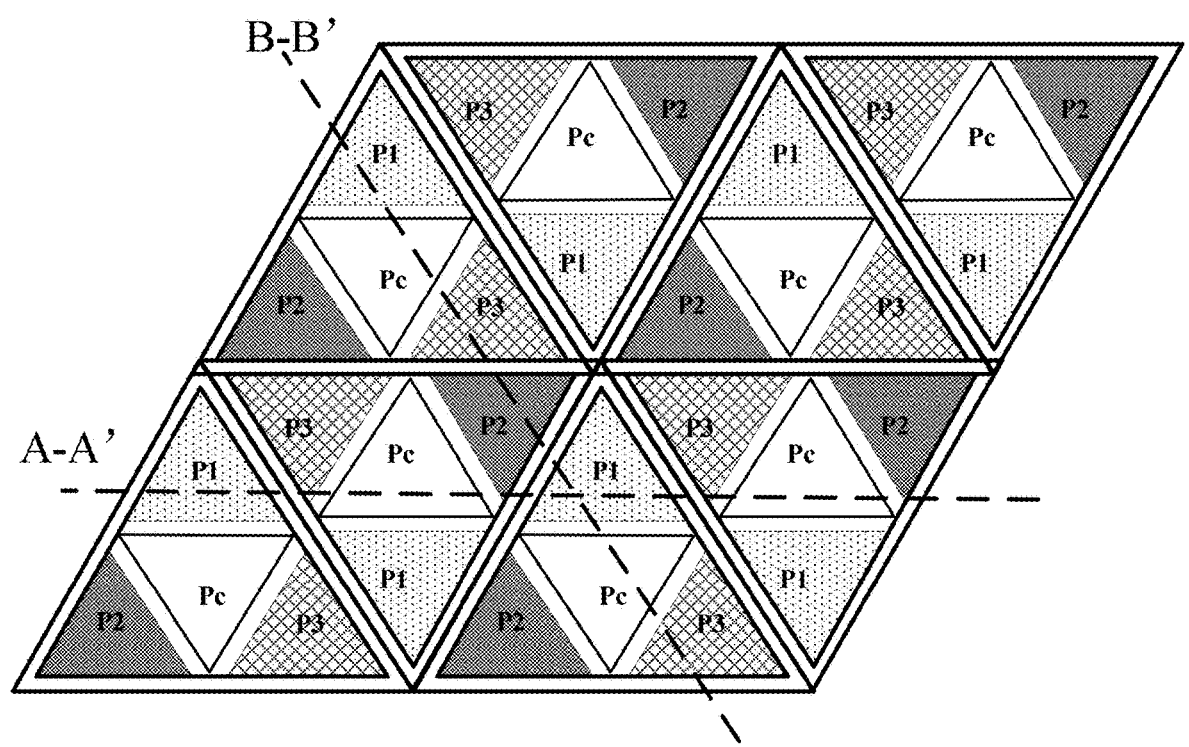
FIG. 5 is yet another structural schematic diagram of a pixel structure in an embodiment of the present disclosure.

FIG. 5 is yet another structural schematic diagram of a pixel structure in an embodiment of the present disclosure. In FIG. 5, eight pixel units in the pixel structure are shown, by taking that a white sub-pixel W corresponds to the center sub-pixel Pc, a red sub-pixel R, a green sub-pixel G, and a blue sub-pixel B may correspond to the third sub-pixel P3, the first sub-pixel P1, and the second sub-pixel P2, respectively, as an example. Hereinafter a structure of the display substrate will be described by taking the display substrate including a pixel structure as shown in FIG. 5 as an example.

Figure 6A:
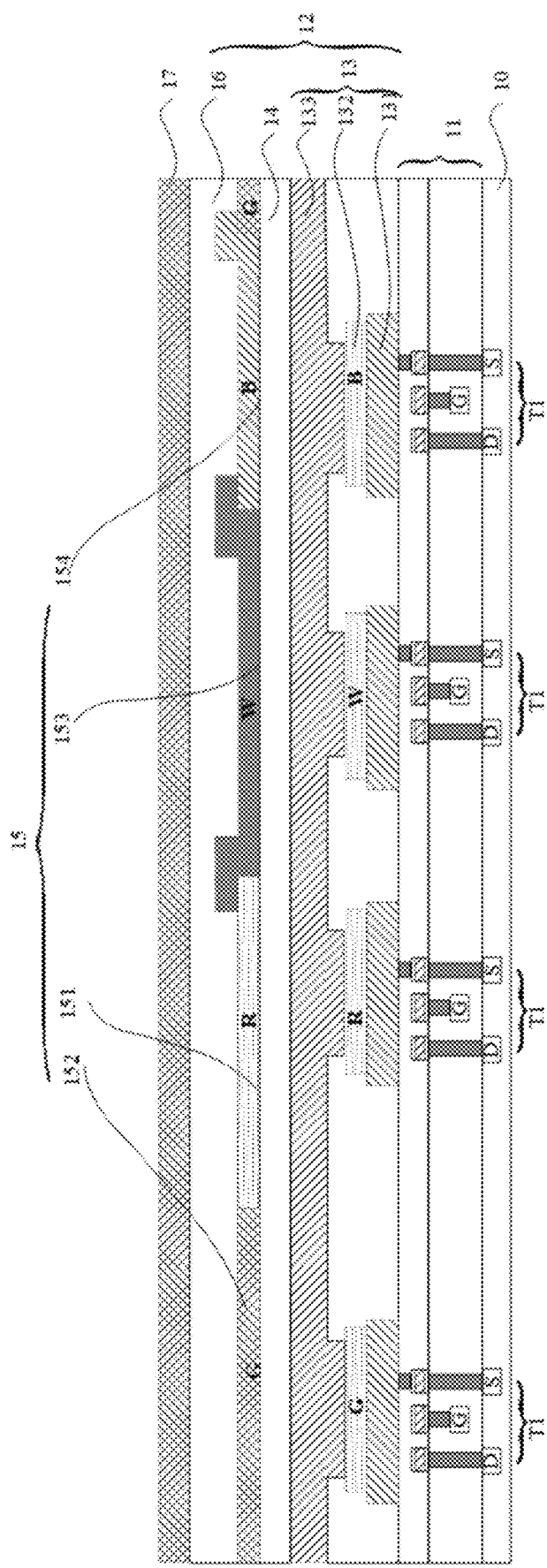
FIG. 6A is a partial structural schematic diagram of a A-A' section when a display substrate includes the pixel structure as shown in FIG. 5 in an embodiment of the present disclosure.
Figure 6B:
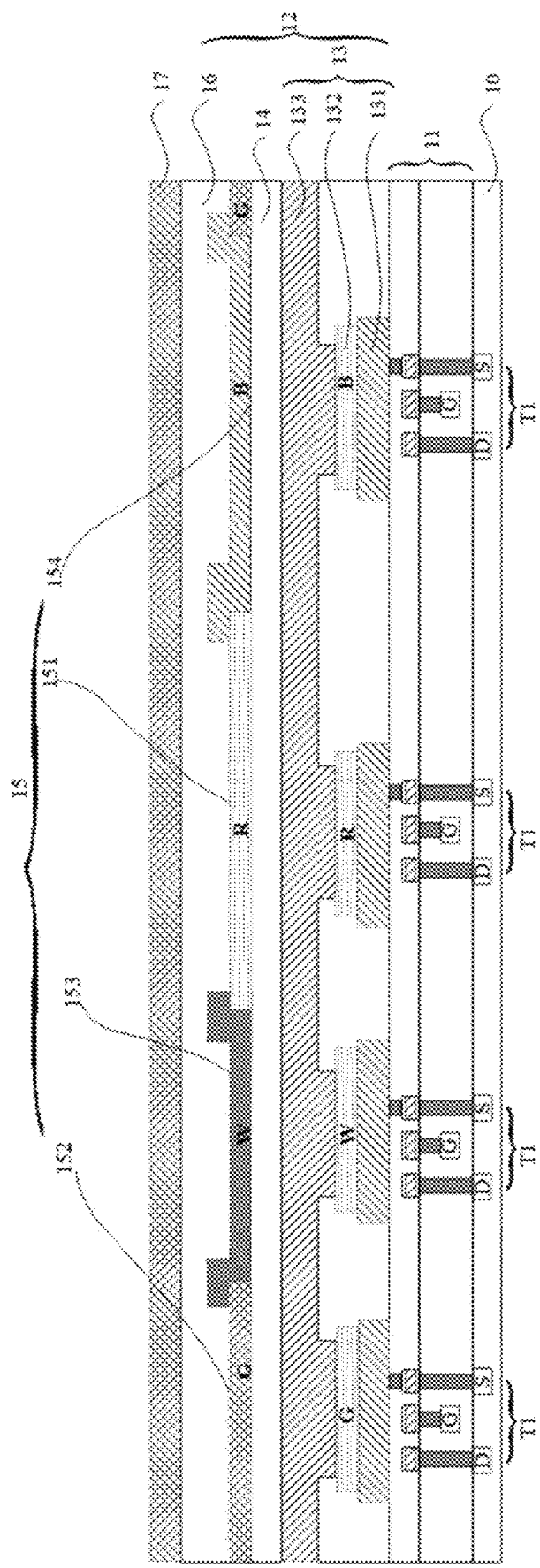
FIG. 6B is a partial structural schematic diagram of a B-B' section when a display substrate includes the pixel structure as shown in FIG. 5 in an embodiment of the present disclosure.

FIG. 6A is a partial structural schematic diagram of a A-A' section when a display substrate includes the pixel structure as shown in FIG. 5 in an embodiment of the present disclosure, and FIG. 6B is a partial structural schematic diagram of a B-B' section when a display substrate includes the pixel structure as shown in FIG. 5 in an embodiment of the present disclosure.

As shown in FIG. 6A and FIG. 6B, in a direction perpendicular to the display substrate, the display substrate may include: an underlay substrate 10, a pixel driving circuit 11 disposed on the underlay substrate 10, and a pixel structure 12 disposed on one side of the pixel driving circuit 11 away from the underlay substrate 10. For example, the pixel driving circuit 11 may include a plurality of pixel circuits, wherein a pixel circuit is disposed to drive a plurality of subsequently formed light-emitting elements in a pixel structure. For clarity and simplicity, FIG. 6A and FIG. 6B only schematically illustrate one transistor T1 in each pixel circuit in the pixel driving circuit 11, wherein the transistor T1 is disposed to be coupled with a subsequently formed light-emitting element. For example, the pixel driving circuit 11 may further include various wirings, such as a scanning signal line and a data signal line, etc., which is not limited by the embodiment of the present disclosure. For example, the underlay substrate 10 may be a silicon-based underlay substrate, but is not limited thereto.

In an exemplary embodiment, as shown in FIG. 6A and FIG. 6B, taking the transistor T1 as an example, transistors T1 in the pixel driving circuit 11 may each include a gate electrode G, a source electrode S, and a drain electrode D. For example, the three electrodes are electrically connected with three electrode connecting parts, respectively, such as electrically connected through vias filled with tungsten metal (i.e., tungsten vias, W-vias). Furthermore, the three electrodes may be electrically connected with other electrical structures (e.g., transistors, wirings, light-emitting elements, or the like) through corresponding electrode connecting parts, respectively.

In an exemplary embodiment, as shown in FIG. 6A and FIG. 6B, in a direction perpendicular to the display substrate, the pixel structure 12 may include: a plurality of light-emitting elements 13 formed on the pixel driving circuit 11. For example, each light-emitting element 13 may include a first electrode 131 (for example, as an anode), an organic light-emitting function layer 132, and a second electrode 133 (for example, as a cathode) which are stacked in sequence. For example, the first electrode 131 may be electrically connected to the source electrode S of the corresponding transistor T1 through the tungsten via (such as through a connecting part corresponding to the source electrode S). Herein, the positions of the source electrode S and the drain electrode D may be exchanged, i.e., the first electrode 131 may be connected to the drain electrode D instead. For example, the organic light-emitting function layer 132 may include an organic light-emitting layer, as well as one or more of an electron injection layer, an electron transport layer, a hole injection layer, and a hole transport layer. For example, the second electrode 133 may be a transparent electrode. For example, the second electrode 133 may be a common electrode, that is, a plurality of light-emitting elements 13 share the second electrode 133 on a whole surface.

In an exemplary embodiment, as shown in FIG. 6A and FIG. 6B, in a direction perpendicular to the display substrate, the pixel structure 12 may further include a first encapsulation layer 14, a color light filtering layer 15, and a second encapsulation layer 16 which are disposed on a plurality of light-emitting elements 13 in sequence, and the display substrate may further include a cover plate 17 which is disposed on one side of the second encapsulation layer 16 away from the underlay substrate 11. For example, the color light filtering layer 15 may include a plurality of light filtering units, wherein one light filtering unit and one corresponding light-emitting element may form one sub-pixel. For example, the first encapsulation layer 14 and the second encapsulation layer 16 may be any one or more of polymer and ceramic thin film encapsulation layers, but are not limited thereto. For example, a material of the light filtering unit may be a photoresist, but is not limited thereto. For example, the cover plate 17 may be a glass cover plate, but is not limited thereto.

In an exemplary embodiment, the color light filtering layer 15 may include a red light filtering unit R, a green light filtering unit G, a blue light filtering unit B, and a white light filtering unit W. Herein, the red light filtering unit R, the green light filtering unit G, the blue light filtering unit B, and the white light filtering unit W may correspond to a red sub-pixel, a green sub-pixel, a blue sub-pixel, and a white sub-pixel, respectively.

For example, when a color light filtering layer is prepared, the color light filtering layer may be two layers of photoresist, wherein, a green photoresist layer for forming the green light filtering unit G and a red photoresist layer for forming the red light filtering unit R are first prepared to form a first layer of photoresist; then, a white photoresist layer for forming the white light filtering unit W and a blue photoresist layer for forming the blue light filtering unit B are prepared to form a second layer of photoresist.

For example, taking that the center sub-pixel is the white sub-pixel, the first sub-pixel, the second sub-pixel, and the third sub-pixel may be sub-pixels of different colors among the red sub-pixel, the green sub-pixel, and the blue sub-pixel as an example, a color glue overlapping structure of the color light filtering layer may include the following structures: inside a single pixel unit, an orthographic projection of the white photoresist layer corresponding to the white sub-pixel on the underlay substrate has an overlapping region with an orthographic projection of the blue photoresist layer corresponding to the blue sub-pixel adjacent to the white sub-pixel, the green photoresist layer corresponding to the green sub-pixel, and the red photoresist layer corresponding to the red sub-pixel on the underlay substrate (at this time, the white sub-pixel is located inside a region surrounded by the blue sub-pixel, the green sub-pixel, and the red sub-pixel); between two adjacent pixel units, when the red sub-pixel is adjacent to the green sub-pixel, an orthographic projection of the red photoresist layer corresponding to the red sub-pixel on the underlay substrate is in contact but has no overlapping region with an orthographic projection of the green photoresist layer corresponding to the green sub-pixel on the underlay substrate; between two adjacent pixel units, when the blue sub-pixel is adjacent to the green sub-pixel, an orthographic projection of the blue photoresist layer corresponding to the blue sub-pixel on the underlay substrate has an overlapping region with an orthographic projection of the green photoresist layer corresponding to the green sub-pixel on the underlay substrate; and between two adjacent pixel units, when the blue sub-pixel is adjacent to the red sub-pixel, an orthographic projection of the blue photoresist layer corresponding to the blue sub-pixel on the underlay substrate has an overlapping region with an orthographic projection of the red photoresist layer corresponding to the red sub-pixel on the underlay substrate.

In an exemplary embodiment, the color light filtering layer 15 may include a red light filtering unit R, a green light filtering unit G, a blue light filtering unit R, and a yellow light filtering unit Y. The red light filtering unit R, the green light filtering unit G, the blue light filtering unit R, and the yellow light filtering unit Y may correspond to a red sub-pixel, a green sub-pixel, and a blue sub-pixel, and a yellow sub-pixel, respectively.

In an exemplary embodiment, an arrangement order of the emitting colors of the first sub-pixel P1, the second sub-pixel P2, the third sub-pixel P3, and the center sub-pixel Pc may be arbitrarily set. For example, taking that red, green, and blue may correspond to the emitting color of the third sub-pixel P3, the emitting color of the first sub-pixel P1, and the emitting color of the second sub-pixel P2, respectively, and white corresponds to the emitting color of the center sub-pixel Pc as an example, a red sub-pixel, a green sub-pixel, and a blue sub-pixel may correspond to the third sub-pixel P3, the first sub-pixel P1, and the second sub-pixel P2, respectively, and a white sub-pixel may correspond to the center sub-pixel Pc, then one red sub-pixel, one green sub-pixel, one blue sub-pixel, and a white sub-pixel located inside a region surrounded by the red sub-pixel, the green sub-pixel, and the blue sub-pixel may form one pixel unit. For another example, taking that red, green, and blue may correspond to the emitting color of the third sub-pixel P3, the emitting color of the first sub-pixel P1, and the emitting color of the second sub-pixel P2, respectively, and yellow corresponds to the emitting color of the center sub-pixel Pc as an example, a red sub-pixel, a green sub-pixel, and a blue sub-pixel may correspond to the third sub-pixel P3, the first sub-pixel P1, and the second sub-pixel P2, respectively, and a yellow sub-pixel may correspond to the center sub-pixel Pc, then one red sub-pixel, one green sub-pixel, one blue sub-pixel, and a yellow sub-pixel located inside a region surrounded by the red sub-pixel, the green sub-pixel, and the blue sub-pixel may form one pixel unit.

In an exemplary embodiment, taking that the white light filtering unit W corresponds to a center light filtering unit 153 in the center sub-pixel, and the red light filtering unit R, the green light filtering unit G, and the blue light filtering unit B may correspond to a third light filtering unit 151 in the third sub-pixel, a first light filtering unit 152 in the first sub-pixel, and a second light filtering unit 154 in the second sub-pixel, respectively, as an example, as shown in FIG. 6A, for two adjacent pixel units, when the red light filtering unit 151 is adjacent to the green light filtering unit 152, an orthographic projection of the red light filtering unit 151 on the underlay substrate is in contact but has no overlapping region with an orthographic projection of the green light filtering unit 152 on the underlay substrate; as shown in FIG. 6A, for two adjacent pixel units, when the blue light filtering unit 154 is adjacent to the green light filtering unit 152, an orthographic projection of the blue light filtering unit 154 on the underlay substrate has an overlapping region with an orthographic projection of the green light filtering unit 152 on the underlay substrate; as shown in FIG. 6B, for two adjacent pixel units, when the blue light filtering unit 154 is adjacent to the red light filtering unit 151, an orthographic projection of the blue light filtering unit 154 on the underlay substrate has an overlapping region with an orthographic projection of the red light filtering unit 151 on the underlay substrate.

In an exemplary embodiment, as shown in FIGS. 6A and 6B, taking that the white light filtering unit W corresponds to the center light filtering unit 153 in the center sub-pixel, and the red light filtering unit R, the green light filtering unit G, and the blue light filtering unit B may correspond to the third light filtering unit 151 in the third sub-pixel, the first light filtering unit 152 in the first sub-pixel, and the second light filtering unit 154 in the second sub-pixel, respectively, as an example, inside each pixel unit, an orthographic projection of the white light filtering unit W on the underlay substrate has an overlapping region with an orthographic projection of the red light filtering unit R, the green light filtering unit G, and the blue light filtering unit B, which is adjacent to the white light filtering unit W, on the underlay substrate. Here, FIG. 6A shows that within the same pixel unit, an orthographic projection of the white light filtering unit W on the underlay substrate has an overlapping region with an orthographic projection of the red light filtering unit R and the blue light filtering unit B, which are located on different sides of the white light filtering unit W and adjacent to the white light filtering unit W, on the underlay substrate. FIG. 6B shows that within the same pixel unit, an orthographic projection of the white light filtering unit W on the underlay substrate has an overlapping region with an orthographic projection of the red light filtering unit R and the green light filtering unit G, which are located on different sides of the white light filtering unit W and adjacent to the white light filtering unit W, on the underlay substrate.

In an exemplary embodiment, the display substrate may include, but is not limited to, an OLED display substrate or a Micro OLED display substrate. Here, no limit is made thereto in the embodiment of the present disclosure.

In this way, in the pixel structure of the display substrate in the embodiment of the present disclosure, the center sub-pixel within the same pixel unit is disposed to be located inside the region surrounded by the first sub-pixel, the second sub-pixel, and the third sub-pixel, so that within a single pixel unit, a first sub-pixel, a second sub-pixel, and a third sub-pixel surround a center sub-pixel, and because the minimum distance between the center sub-pixel and at least one of the first sub-pixel, the second sub-pixel, and the third sub-pixel within the same pixel unit is smaller than the distance between two adjacent pixel units, then, when a hole is injected into at least one of the first sub-pixel, the second sub-pixel, and the third sub-pixel within the same pixel unit, a leakage current will flow to the corresponding center sub-pixel, and the center sub-pixel is made to emit light by using the leakage current.

Figure 7:
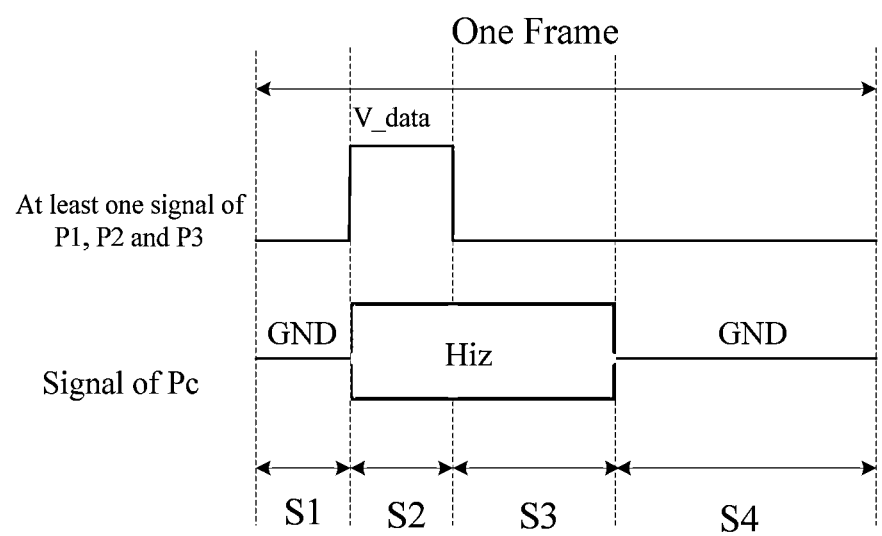
FIG. 7 is a signal timing diagram of a drive method for a display substrate in an embodiment of the present disclosure.

An embodiment of the present disclosure further provides a driving method for a display substrate, wherein the display substrate is a display substrate provided by any of the above embodiments. The driving method provided by the present embodiment may include four stages, which are a reset stage S1, a data writing stage S2, a light-emitting stage S3, and a non-light-emitting stage S4, respectively. FIG. 7 is a signal timing diagram of a drive method for a display substrate in an embodiment of the present disclosure, and FIG. 7 shows timing waveforms of signals inputted to different sub-pixels in a pixel unit in each stage. The driving method for the display substrate provided by the embodiment of the present disclosure will be described below with reference to the signal timing diagram shown in FIG. 7. Here, values of electric potentials of the signal timing diagram shown in FIG. 7 are only schematic, and do not represent true values of electric potentials or relative proportions.

As shown in FIG. 7, the driving method may include the following acts S701 to S702.

In the act 701, for at least one of a plurality of pixel units, a data signal V_data is inputted to at least one of a first sub-pixel P1, a second sub-pixel P2, and a third sub-pixel P3 in the at least one pixel unit through a pixel driving circuit in a data writing stage S2.

In the act 702, a high impedance signal Hiz is inputted to a center sub-pixel through the pixel driving circuit in the data writing stage S2 and a light-emitting stage S3 after the data writing stage S2, to drain a leakage current between at least one of the first sub-pixel P1, the second sub-pixel P2, and the third sub-pixel P3 in the at least one pixel unit and the center sub-pixel Pc to the center sub-pixel Pc, driving the center sub-pixel Pc to emit light.

Here, when a voltage of a sub-pixel in the display substrate is measured, data signals appear as pulse signals with high and low levels; and the high impedance signal shows that the signal is disconnected, neither the high level nor the low level, and there is no voltage.

In this way, in the pixel structure of the display substrate in the embodiment of the present disclosure, the center sub-pixel within the same pixel unit is disposed to be located inside a region surrounded by the first sub-pixel, the second sub-pixel, and the third sub-pixel, and because a minimum distance between the center sub-pixel and at least one of the first sub-pixel, the second sub-pixel, and the third sub-pixel within the same pixel unit is smaller than a distance between two adjacent pixel units, then, when a hole is injected into at least one of the first sub-pixel, the second sub-pixel, and the third sub-pixel within the same pixel unit, a leakage current will flow to the corresponding center sub-pixel, and the center sub-pixel is made to emit light by using the leakage current. Therefore, it can be that a data signal is not input to the center sub-pixel during the data writing stage and the light-emitting stage after the data writing stage, instead, a high impedance signal is input to the center sub-pixel, and a data signal is input to at least one of the first sub-pixel, the second sub-pixel, and the third sub-pixel through the pixel driving circuit in the data writing stage. In this way, not only it can be ensured that the leakage current is normally received by the center sub-pixel, but also the leakage current flowing into the center sub-pixel can be effectively improved, and thus, it can be achieved that the transmittance and the luminous efficiency of the display substrate are improved, and the power consumption is reduced. Furthermore, because leakage currents all flow to the center sub-pixel, the color crosstalk problem among the first sub-pixel, the second sub-pixel, and the third sub-pixel in the display substrate can be improved.

For example, taking the display substrate in the embodiment of the present disclosure being applied to a 0.71 inch full high definition Micro OLED display device as an example, and taking that it is set in the 0.71 inch full high definition Micro OLED display device, a distance between the center sub-pixel and the first sub-pixel within the same pixel unit is 0.6 μm (micron), a distance between the center sub-pixel and the second sub-pixel within the same pixel unit is 0.6 μm, a distance between the center sub-pixel and the third sub-pixel within the same pixel unit is 0.6 μm, a distance between two adjacent pixel units is 1.20 μm, the first sub-pixel, the second sub-pixel, and the third sub-pixel are all isosceles triangles with bottom edges of 10.58 μm and waists of 7.48 μm, and the center sub-pixel is an isosceles triangle with a bottom edge of 6.64 μm and a waist of 4.69 μm as an example, the inventor of the present disclosure obtains through experiments that the transmittance and the luminous efficiency of the 0.71 inch full high definition Micro OLED display device can be improved by about 75%.

In an exemplary embodiment, as shown in FIG. 7, the driving method may further include: a ground signal GND is inputted to a center sub-pixel Pc in at least one pixel unit through the pixel driving circuit in a reset stage S1 before the data writing stage S2 and a non-light-emitting stage S4 after the light-emitting stage S3.

Here, when a voltage of a sub-pixel in the display substrate is measured, the ground signal appears as a direct current signal, such as a zero voltage, and is a reference signal of the pixel driving circuit.

In an exemplary embodiment, a voltage of the data signal is greater than a voltage of the ground signal.

In this way, the ground signal is inputted to the center sub-pixel by the pixel driving circuit to perform resetting, so that it can be ensured that no hole or charge accumulation is on the center sub-pixel, and thus, false light emission can be avoided. Moreover, resetting may be performed for injection of a leakage current of a next frame, which can improve the transmittance and the luminous efficiency more effectively, reduce the power consumption more effectively, and improve the color crosstalk problem more effectively.

An embodiment of the present disclosure further provides a display apparatus, including the display substrate provided by any of the above embodiments.

In an exemplary embodiment, the display apparatus may be any product or component with a display function such as a mobile phone, a tablet computer, a television, a display, a notebook computer, a digital photo frame, or a navigator, etc. There is no limitation on a type of the display apparatus in the embodiment of the present disclosure.

Although the implementation modes of the present disclosure are disclosed above, the contents are only implementation modes for easily understanding the present disclosure and not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A pixel structure, comprising: a plurality of pixel units, wherein
each pixel unit comprises a first sub-pixel, a second sub-pixel, a third sub-pixel, and a center sub-pixel, wherein the center sub-pixel is located inside a region surrounded by the first sub-pixel, the second sub-pixel, and the third sub-pixel; and
a minimum distance between the center sub-pixel located inside the region surrounded by the first sub-pixel, the second sub-pixel, and the third sub-pixel and at least one of the first sub-pixel, the second sub-pixel, and the third sub-pixel within a same pixel unit is smaller than a distance between two adjacent pixel units.

2. The pixel structure of claim 1, wherein
a distance between the center sub-pixel and the first sub-pixel within the same pixel unit is a first distance;
a distance between the center sub-pixel and the second sub-pixel within the same pixel unit is a second distance;
a distance between the center sub-pixel and the third sub-pixel within the same pixel unit is a third distance;
the distance between two adjacent pixel units is a fourth distance; and
the minimum distance between the center sub-pixel and at least one of the first sub-pixel, the second sub-pixel, and the third sub-pixel within the same pixel unit being smaller than the distance between two adjacent pixel units, comprises one or more of: a ratio of the first distance to the fourth distance being 0.4 to 0.6, a ratio of the second distance to the fourth distance being 0.4 to 0.6, and a ratio of the third distance to the fourth distance being 0.4 to 0.6.

3. The pixel structure of claim 2, wherein
the first distance, the second distance, and the third distance are equal.

4. The pixel structure of claim 1, wherein
emitting colors of the center sub-pixel, the first sub-pixel, the second sub-pixel, and the third sub-pixel within the same pixel unit are different.

5. The pixel structure of claim 4, wherein
an emitting color of the center sub-pixel is any one of white and yellow;
an emitting color of the first sub-pixel is any one of red, green, and blue;
an emitting color of the second sub-pixel is any one of red, green, and blue; and
an emitting color of the third sub-pixel is any one of red, green, and blue.

6. The pixel structure of claim 1, wherein a shape of each pixel unit is a triangle.

7. The pixel structure of claim 6, wherein
shapes of the first sub-pixel, the second sub-pixel, the third sub-pixel, and the center sub-pixel are all triangles.

8. The pixel structure of claim 7, wherein
the shapes of the first sub-pixel, the second sub-pixel, the third sub-pixel, and the center sub-pixel and the shape of each pixel unit are all isosceles triangles; or
the shapes of the first sub-pixel, the second sub-pixel, the third sub-pixel, and the center sub-pixel and the shape of each pixel unit are all right triangles.

9. The pixel structure of claim 1, wherein
an area of the first sub-pixel, an area of the second sub-pixel, and an area of the third sub-pixel within the same pixel unit are all larger than an area of the center sub-pixel.

10. The pixel structure of claim 9, wherein
areas of the first sub-pixel, the second sub-pixel, and the third sub-pixel are equal.

11. A display substrate, comprising: an underlay substrate, a pixel driving circuit, and a pixel structure according to claim 1 which are stacked in sequence.

12. The display substrate of claim 11, wherein for the first sub-pixel, the second sub-pixel, the third sub-pixel, and the center sub-pixel within the same pixel unit:
the first sub-pixel comprises a first light-emitting element and a first light filtering unit which are stacked in sequence;
the second sub-pixel comprises a second light-emitting element and a second light filtering unit which are stacked in sequence;
the third sub-pixel comprises a third light-emitting element and a third light filtering unit which are stacked in sequence;
the center sub-pixel comprises a center light-emitting element and a center light filtering unit which are stacked in sequence; and there is an overlapping region between an orthographic projection of the center light filtering unit on the underlay substrate and each of orthographic projections of the first light filtering unit, the second light filtering unit, and the third light filtering unit on the underlay substrate.

13. The display substrate of claim 12, wherein
colors of the center light filtering unit, the first light filtering unit, the second light filtering unit, and the third light filtering unit are different.

14. The display substrate of claim 13, wherein
the center light filtering unit is any one of a white light filtering unit and a yellow light filtering unit;
the first light filtering unit is any one of a red light filtering unit, a green light filtering unit, and a blue light filtering unit;
the second light filtering unit is any one of the red light filtering unit, the green light filtering unit, and the blue light filtering unit; and
the third light filtering unit is any one of the red light filtering unit, the green light filtering unit, and the blue light filtering unit.

15. The display substrate of claim 14, wherein
for two adjacent pixel units, in a case that the blue light filtering unit is adjacent to the green light filtering unit, there is an overlapping region between an orthographic projection of the blue light filtering unit on the underlay substrate and an orthographic projection of the green light filtering unit on the underlay substrate;
in a case that the blue light filtering unit is adjacent to the red light filtering unit, there is an overlapping region between the orthographic projection of the blue light filtering unit on the underlay substrate and an orthographic projection of the red light filtering unit on the underlay substrate; and
in a case that the red light filtering unit is adjacent to the green light filtering unit, the orthographic projection of the red light filtering unit on the underlay substrate is in contact but has no overlapping region with the orthographic projection of the green light filtering unit on the underlay substrate.

16. A driving method for a display substrate, wherein the display substrate is a display substrate of claim 11, the driving method comprising:

for at least one of the plurality of pixel units, inputting a data signal to at least one of the first sub-pixel, the second sub-pixel, and the third sub-pixel in the at least one pixel unit through a pixel driving circuit in a data writing stage; and inputting a high impedance signal to the center sub-pixel through the pixel driving circuit in the data writing stage and a light-emitting stage after the data writing stage, to drain a leakage current between at least one of the first sub-pixel, the second sub-pixel, and the third sub-pixel in the at least one pixel unit and the center sub-pixel to the center sub-pixel, driving the center sub-pixel to emit light.

17. The driving method of claim 16, further comprising:
inputting a ground signal to the center sub-pixel through the pixel driving circuit in a reset stage before the data writing stage and a non-light-emitting stage after the light-emitting stage.

18. The driving method of claim 17, wherein
a voltage of the data signal is greater than a voltage of the ground signal.

19. A display apparatus, comprising a display substrate of claim 11.

* * * * *